United States Patent

Müller et al.

Patent Number: 5,729,654
Date of Patent: Mar. 17, 1998

[54] VECTOR ENCODING METHOD, IN PARTICULAR FOR VOICE SIGNALS

[75] Inventors: Jörg-Martin Müller, Schwaikheim; Bertram Wächter, Allmersbach/Tal, both of Germany

[73] Assignee: Ant Nachrichtentechnik GmbH, Germany

[21] Appl. No.: 535,107

[22] PCT Filed: Apr. 20, 1994

[86] PCT No.: PCT/DE94/00436

§ 371 Date: Nov. 7, 1996

§ 102(e) Date: Nov. 7, 1996

[87] PCT Pub. No.: WO94/27285

PCT Pub. Date: Nov. 24, 1994

[30] Foreign Application Priority Data

May 7, 1993 [DE] Germany .......... 43 15 313.5

[51] Int. Cl.⁶ .......... G10L 7/02
[52] U.S. Cl. .......... 395/2.31; 395/2.28; 395/2.29; 395/2.26; 395/2.32
[58] Field of Search .......... 395/2.31, 2.26, 395/2.28, 2.29, 2.32

[56] References Cited

U.S. PATENT DOCUMENTS

| | | | |
|---|---|---|---|
| 4,486,899 | 12/1984 | Fushikida | 395/2.26 |
| 4,860,355 | 8/1989 | Copperi | 395/2.22 |
| 4,868,867 | 9/1989 | Davidson et al. | 395/2.39 |
| 4,907,276 | 3/1990 | Aldersberg | 395/2.31 |
| 4,969,192 | 11/1990 | Chen et al. | 395/2.31 |
| 5,327,520 | 7/1994 | Chen | 395/2.28 |
| 5,339,164 | 8/1994 | Lim | 358/261.1 |
| 5,457,783 | 10/1995 | Chhatwal | 395/2.28 |
| 5,621,852 | 4/1997 | Lin | 395/2.28 |

FOREIGN PATENT DOCUMENTS

| | | | |
|---|---|---|---|
| 0266620 | 10/1987 | European Pat. Off. | G10L 9/14 |
| 0294020 | 4/1988 | European Pat. Off. | G10L 9/14 |
| 0504627 | 2/1992 | European Pat. Off. | G10L 9/14 |

*Primary Examiner*—Allen R. MacDonald
*Assistant Examiner*—Vijay Chawan

[57] ABSTRACT

The vector encoding method, particularly for voice signals, includes storing autocorrelation coefficients in one codebook and performing a logic operation on the autocorrelation coefficients with an autocorrelation function for the pulse response of an excitation filter to give the energy of the filtered excitation signal. For additional data reduction only those values having three autocorrelation coefficients other than the value 0 are entered in the codebook. The combination patterns which can be formed from these coefficients occur with the same frequency in the codebook. Because of these features, a transmission of encoded data which is very robust with respect to faults is possible with reduced processing and storage effort.

9 Claims, 3 Drawing Sheets

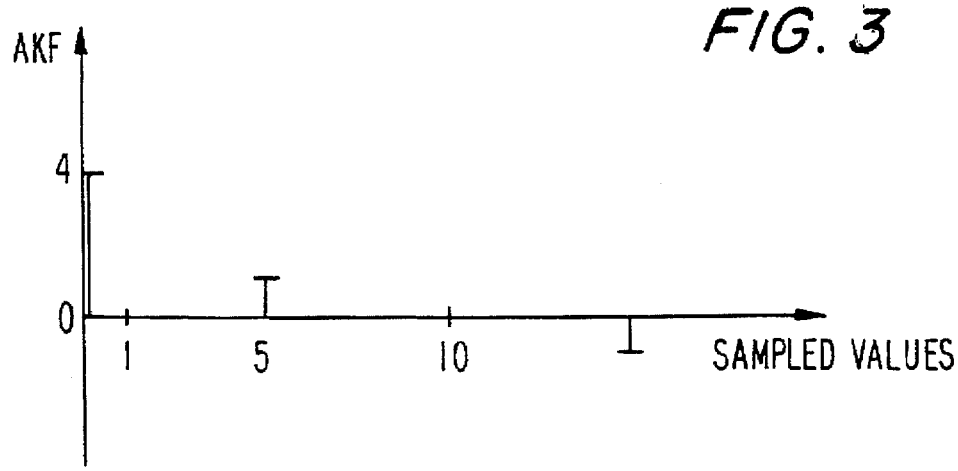
FIG. 3
PART-CODEBOOK   ADDRESS
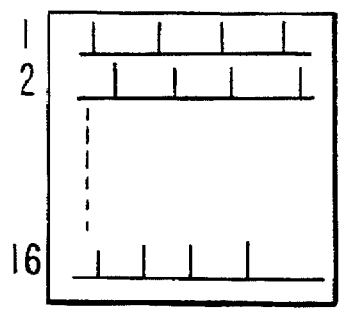   0000
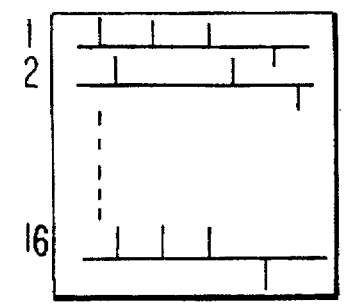   0001
FIG. 4
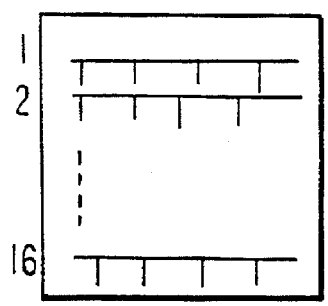   1111

VECTOR ENCODING METHOD, IN PARTICULAR FOR VOICE SIGNALS

BACKGROUND OF THE INVENTION

The invention is based on a vector encoding method, in particular for voice signals, using a codebook for prediction coding.

In the encoding and decoding of voice signals, in particular for mobile radio applications, the voice signal is sampled and subdivided into intervals (time intervals). For each interval, predicted values are formed for different types of signal parameters. Such signal parameters are, for example, short-term parameters for characterizing the formant structure (resonances of the voicebox) and long-term parameters for characterizing the pitch structure (level of tone) of the voice signal (ANT Nachrichtentechnische Berichte [ANT Communication Reports], Issue 5, November 1988, pages 93 to 105). In voice encoding by means of "analysis by synthesis", the model and excitation parameters are quantized, encoded and transmitted to the receiver. For further reducing the bit rate, vector quantization is used (see above; DE/EP 0 266 620 T1; EP 504 627 A2; EP 294 020 A2).

It is known from ANT Nachrichtentechnische Berichte, Issue 5, November 1988, pages 93 to 105, in particular page 102, second column, to page 103, second column, that up to 90% of the components of the codebook vector can be set to zero without impairing the voice quality. In addition, it is proposed there to restrict even further the number of excitation sequences for the filter for synthetic voice generation by choosing not only a fixed position of the pulses (coefficients) but in addition fixed amplitudes for them. There is chosen there a fixed excitation codebook whose vectors comprise four elements other than zero (vector components).

SUMMARY OF THE INVENTION

The object of the present invention is to develop a method of the above-described type in such a way as to provide codebook parameters which have a low error susceptibility, in particular for purposes of transmission over faulty channels, with reduced storage and processing effort.

According to the invention, the vector encoding method comprises storing combination patterns for excitation signals of an excitation filter for generating synthetic signals, in particularly voice signals, with n, advantageously 4, amplitude values other than 0 and having the same magnitudes but differing only in operational sign or addresses for storing the amplitude values in a first codebook; storing respectively associated autocorrelation coefficients in another codebook; and performing a logic operation on the autocorrelation coefficients with an autocorrelation function for pulse response of the excitation filter to give an energy of a filtered excitation signal. Only combination patterns having three autocorrelation coefficients other than zero are allowed and amplitude values other than 0 of the autocorrelation coefficients beyond a correlation maximum ($AKF_{(0)}$) differ only in an operational sign thereof.

Preferred embodiments are explained in more detail in the description hereinbelow and claimed in the appended claims.

The method according to the invention is based on the following perceptions:

The combination patterns formed from the autocorrelation coefficients do not have to be stored. It suffices if their addresses, i.e. their positions are stored. This reduces the storage effort and the processing considerably. Combination patterns and their distribution can be transmitted separately. Since voice codes react more sensitively to pulse patterns (combination patterns of the autocorrelation coefficients) than to their distribution (arrangement of the vector components), a better voice quality is obtained in the case of faulty transmission. For this reason, the method according to the invention can be used advantageously, in particular for mobile radio.

BRIEF DESCRIPTION OF THE DRAWING

An exemplary embodiment of the invention is explained in more detail with reference to the drawings, in which:

FIG. 3 shows an example of the choice of autocorrelation coefficients according to the invention and FIG. 4 shows part-codebooks with the distribution of the pulse patterns.

DESCRIPTION OF THE PREFERRED EMBODIMENTS

For the transmission of voice signals at low bit rates, for example in the range of 2.4 kbit/s to 9.6 kbit/s, use is made, for example, of an RELP voice codec on the "analysis by synthesis" principle. The voice encoding on the RELP principle (ANT Nachrichtentechnische Berichte, Issue 5, 1988, pages 93 to 105), for example, is briefly explained in FIG. 1 for further understanding of the invention. A voice signal s(t) is digitized by means of an A/D converter and is subsequently analyzed.

Figure 1:
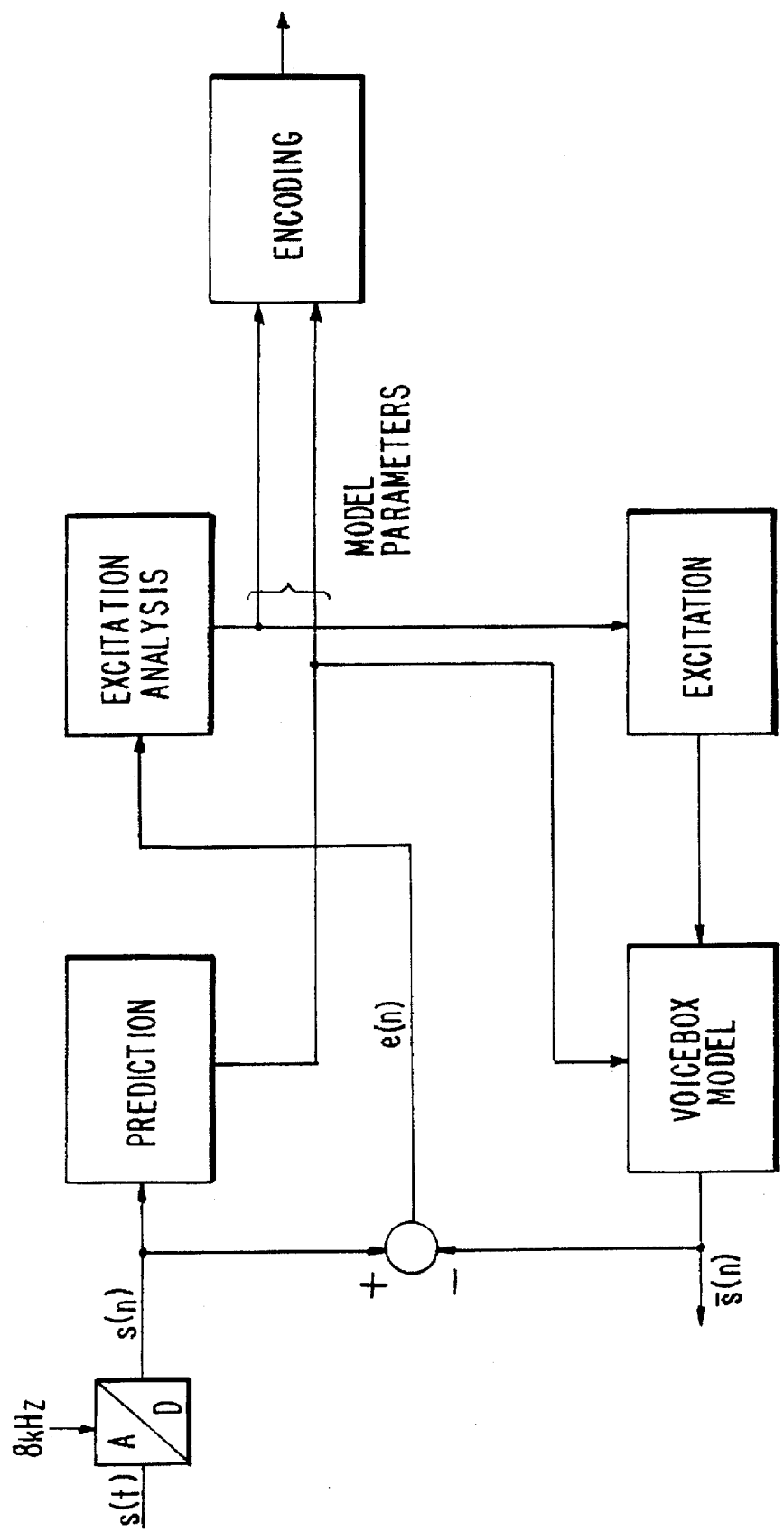
FIG. 1 is a block diagram showing the principle of a method of RELP voice encoding.

This analysis comprises the function blocks of prediction and excitation analysis. To eliminate voice redundancy, a simulation of the voice generation by a linear adaptive model which is suitably excited is used. Only the model and excitation parameters required for the voice synthesis are quantized, encoded and transmitted to the receiver. For determining the model parameters, static dependencies of the sampled voice values are analyzed in the transmitter and largely eliminated by means of linear short-term prediction and, if appropriate, also long-term prediction. By the short-term prediction, correlations between directly successive sampled values are largely eliminated. Correlations between sampled values which lie far apart (pitch structure) are reduced by a subsequent long-term predictor. The result is a signal which has substantially only nonlinear dependencies and the energy of which is greatly reduced in comparison with the energy of the original voice signal. In the "analysis by synthesis", the difference between the original voice signal and the synthesized voice signal is used for calculating the excitation signal (FIG. 1).

Within short voice intervals of about 10 to 30 ms duration, the speech can be considered as a process in something of a steady state. This quasi steady-state condition permits the calculation of predictors whose parameters assume constant values for the duration of the voice interval. A voice interval of 20 ms duration is fixed, for example, as a frame period. Then, at a sampling frequency of 8 kHz, for adaption of the predictor coefficients there are in each case 160 sampled values per frame available. The prediction errors are determined by minimizing the energy of the prediction error per frame. To determine these prediction coefficients, the correlation method is applied to simplify the computational effort.

Figure 2:
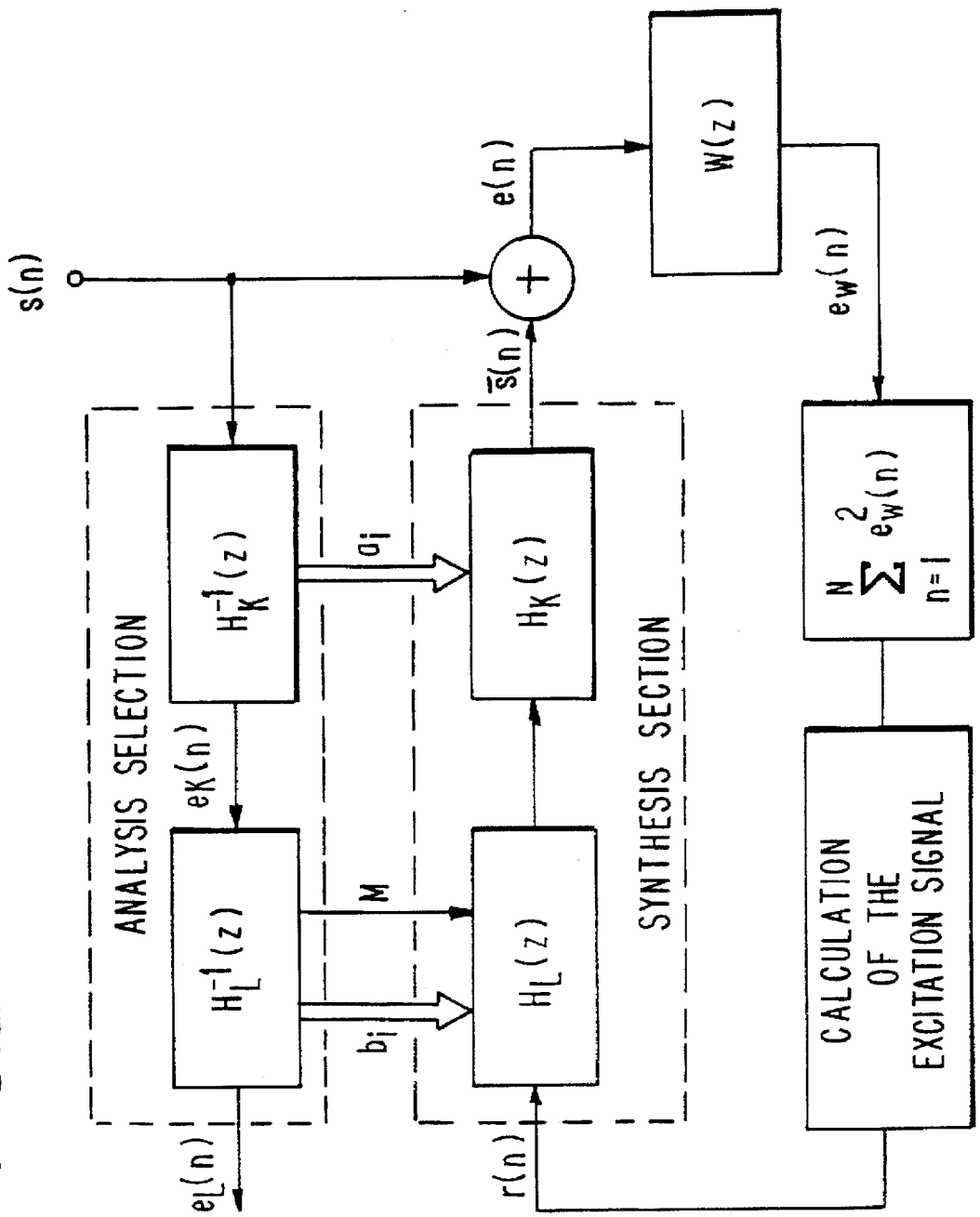
FIG. 2 is a block diagram showing the principle of a method of analysis by synthesis.

After the analysis of the voice signal s(n), the coefficients of the voice synthesis filters, which in FIG. 2 are characterized by the transfer function $H_L(Z)$ $H_K(Z)$, are known. The excitation r(n) for the synthesis filters is either calculated or, according to the invention, read out from a codebook. The output signal s(n) of the synthesis filters is the estimated voice signal. Comparison with the original signal s(n) gives the error signal e(n), which is weighted audiophysiologically by the transfer function $W_{(z)}$. The energy of the error signal is then used for determining an improved excitation signal.

For further reducing the bit rate for transmission, vector quantization is used. The calculation of the excitation signal is replaced by a codebook having L excitation vectors of the dimension D. With the aid of a scaling factor, the energy of each vector is adapted to the energy of the voice signal. The address of that vector having the least error energy is then transmitted to the receiver. Since the prediction error signal approximates very well to Gaussian distribution, the codebook can be filled with random numbers in Gaussian distribution. The advantage of these so-called CELP methods (Codebook Excited Linear Prediction) is, inter alia, that the codebook does not need to be "trained". A further reduction of effort is obtained if codebook vectors which comprise zero vectors are used. Consequently, fewer calculating operations are required for calculating the excitation vector. In ANT Nachrichtentechnische Berichte, Issue 5, November 1988, pages 93 to 105, it was proposed to set as many codebook vectors as possible, for example up to 90%, to zero and to restrict even more the number of excitation sequences by fixing the positions of the coefficients (pulses) and keeping their amplitudes constant. Vectors which comprise four elements other than zero were used there for the codebook.

In the case of the invention, these requirements are restricted still further in favor of the storage requirement and processing effort: only vectors which three autocorrelation coefficients other than zero are used. The autocorrelation coefficients outside the correlation maximum $AKF_{(0)}$ are chosen such that they differ only in their operational sign; i.e. their amplitude is the same.

In FIG. 3 there is illustrated an example of such chosen autocorrelation coefficients with n=4 pulses, i.e. amplitude bits within a frame of, for example, 40 sampled values. At the correlation maximum $AKF_{(0)}$, the amplitude value is 4. Since this value is constant for all pulse patterns with n pulses, it does not have to be stored. The other pulses other than zero have the amplitude 1. For example, the fifth sampled value is +1 and the fifteenth sampled value is −1.

The autocorrelation coefficients used here are defined such that, when they undergo a logic operation with the autocorrelation function of the pulse response of an excitation filter for generating synthetic signals (voice signals), the energy of the filtered excitation signal is obtained.

In addition, it is required for all combination patterns which can be formed from such autocorrelation coefficients that they occur with the same frequency in the codebook. Due to the last requirement, the codebook of a size $2^L$ can be subdivided into n part-codebooks if n pulses other than zero are allowed in the excitation signal, which corresponds to $2^n$ possible combination patterns. Each of the n part-codebooks has the size $2^{L-n}$ and contains only pulse patterns of the same type. Some of the $2^n$ (n=4)=16 possible part-codebooks are represented in FIG. 4. The pulse patterns in each of the part-codebooks are the same in each case (sequence of the +1 and −1 values); only the position of the individual pulses differs. In the first part-codebook, the pulse pattern comprises only four positive pulses, in the second part-codebook 3 positive pulses and one negative pulse, etc. The codebook length L accordingly comprises 256 vectors. Due to the same frequency of the combination patterns (pulse patterns), the combination patterns can be transmitted separately from the distribution (position) of the pulses. The combination patterns do not themselves have to be stored and transmitted. It suffices if each of the 16 part-codebooks with the known combination pattern is distinguishable from the other. This can be realized most simply if each part-codebook, and consequently the respective pulse pattern, is assigned a different address, for example the first part-codebook is assigned the address 0000 and the second part-codebook is assigned the address 0001, etc. (FIG. 4). For the position of the pulses in the part-codebooks, likewise only one address in each case has to be stored and transmitted.

Instead of creating 16 part-codebooks, it suffices to produce only 8 part-codebooks with different combination patterns (part-codebooks 1 to 8). The part-codebooks 9 to 16 can then be created by simple-inversion of the operational sign of the combination patterns. For example, the pattern 11-1-1 becomes the pattern -1-111.

The separation of the pulse patterns from the pulse distribution results in a very high error robustness of the voice transmission, in particular in the case of transmission faults, since codecs react more sensitively to pulse patterns than to their distribution. The pulse patterns can therefore be provided with a higher error protection, for example in a channel coding for the transmission, than the information on the specific position of their pulses.

We claim:

1. A vector encoding method using a codebook method, said vector encoding method comprising the steps of:

a) storing one of combination patterns for excitation signals of an excitation filter for generating synthetic signals with n amplitude values other than 0 and having the same magnitudes but differing only in operational sign and addresses for storing said amplitude values in a first codebook;

b) storing respectively associated autocorrelation coefficients in another codebook; and c) performing a logic operation on said autocorrelation coefficients with an autocorrelation function for pulse response of said excitation filter to give an energy of a filtered excitation signal;

wherein only ones of said combination patterns having three autocorrelation coefficients other than zero are allowed and amplitude values other than 0 of the autocorrelation coefficients beyond a correlation maximum $(AKF_{(0)})$ differ only in an operational sign thereof.

2. The vector encoding method as defined in claim 1, wherein said storing of said autocorrelation coefficients is such that only ones of said autocorrelation coefficients other than 0 and outside said correlation maximum $(AKF_{(0)})$ are stored in said first codebook.

3. The vector encoding method as defined in claim 1, further comprising forming a part-codebook for each possible one of said combination patterns and only entering a respective position of said combination patterns in said part-codebook.

4. The vector encoding method as defined in claim 3, further comprising identifying each of said part-codebooks by a code word so as to distinguish said part-codebooks from each other.

5. The vector encoding method as defined in claim 3, wherein said combination patterns consist of four coefficients with amplitude values selected from the group consisting of +1 and −1.

6. The vector encoding method as defined in claim 3, wherein each of said codebooks have a length of 246 vectors and 16 part-code books are formed and each of said part-code books contains combination patterns for 16 vectors entered line-by-line.

7. The vector encoding method as defined in claim 6, wherein each of 8 of said 16 part-code books is related to one of another 8 of said part-code books by inverting an operational sign of said entries in said code-books.

8. The vector encoding method as defined in claim 1, wherein said synthetic signals are voice signals.

9. The vector encoding method as defined in claim 1, wherein said synthetic signals have four of said amplitude values different from zero.

* * * * *